United States Patent
Akiyoshi et al.

[11] Patent Number: 5,889,220
[45] Date of Patent: Mar. 30, 1999

[54] COPPER-TUNGSTEN ALLOYS AND THEIR MANUFACTURING METHODS

[75] Inventors: Naoyoshi Akiyoshi; Kimio Nakada; Katsumi Koda; Hiroyuki Yamabe; Masao Nakayama, all of Osaka, Japan

[73] Assignee: Toho Kinzoku Co, Ltd, Osaka, Japan

[21] Appl. No.: 704,676

[22] PCT Filed: Jan. 19, 1996

[86] PCT No.: PCT/JP96/00080

§ 371 Date: Dec. 23, 1996

§ 102(e) Date: Dec. 23, 1996

[87] PCT Pub. No.: WO96/22401

PCT Pub. Date: Jul. 25, 1996

[30] Foreign Application Priority Data

Jan. 20, 1995 [JP] Japan ................................ 7-026320

[51] Int. Cl.$^6$ .................................................. B22F 9/00
[52] U.S. Cl. ........................ 75/248; 75/230; 148/423; 420/430; 419/10
[58] Field of Search ................. 148/423; 420/430; 419/10; 75/230, 248

[56] References Cited

U.S. PATENT DOCUMENTS

| | | |
|---|---|---|
| 2,250,099 | 7/1941 | Hensel .................................. 171/325 |
| 3,576,619 | 4/1971 | Emley . |
| 3,685,134 | 8/1972 | Blue ...................................... 29/420.5 |
| 3,904,383 | 9/1975 | Murphy et al. ......................... 29/196 |

FOREIGN PATENT DOCUMENTS

| | | |
|---|---|---|
| 1548976 | 12/1967 | France . |
| 42-22134 | 10/1942 | Japan . |
| 49-28828 | 7/1974 | Japan . |
| 2-107741 | 4/1990 | Japan . |
| 4-131334 | 5/1992 | Japan . |
| 1194600 | 6/1970 | United Kingdom . |

OTHER PUBLICATIONS

European Patent Office Communication with Supplementary European Search Report for European Patent Application No. 96 90 0713 dated Feb. 4, 1997.
International Search Report for International Application No. PCT/JP96/00080 dated May 16, 1996.

*Primary Examiner*—John Sheehan
*Attorney, Agent, or Firm*—Armstrong, Westerman, Hattori, McLeland & Naughton

[57] ABSTRACT

Copper-tungsten alloys used for materials of electrode, electric contacts, package materials for semiconductors, heat sink and their manufacturing methods. The copper-tungsten alloy contains preferably 5 to 30 wt. % of copper, 0.002 to 0.04 wt. % of phosphor, the remaining portion being substantially all tungsten, and it is preferable to contain in these alloys 0.1 to 0.5% of cobalt, nickel or iron or else any combined two out of these three.

2 Claims, 3 Drawing Sheets

COPPER-TUNGSTEN ALLOYS AND THEIR MANUFACTURING METHODS

TECHNICAL FIELD

This invention relates to the copper-tungsten alloys used in electrodes, electric contact materials, package materials for semiconductors, heat sink, etc. and to their manufacturing methods.

BACKGROUND TECHNOLOGY

The copper-tungsten alloy is a material endowed with high electric conductivity of copper and arc erosion resistance of tungsten, which has been used from olden times as electrode material and electric contact. Recently, it has come to be employed as a package material for semiconductors and heat sink members in the electronic field.

Because copper and tungsten do not undergo solid solution, the copper-tungsten alloy is manufactured by powder metallurgy process. The manufacturing method by this powder metallurgy process is roughly divided into two: infiltration process and powder mixing process. The infiltration process consists in press-molding and sintering only the tungsten powder to make a porous tungsten skeleton in advance, into which molten copper is impregnated. The powder mixing process press-molds and sinters the powder mixture of copper powder and tungsten powder in a prescribed proportion.

Both the infiltration process and powder mixing process are however problematical. What are at issue for the infiltration process are the difficulty in adjusting the porosity of the tungsten skeleton, that the content of copper is likely to disperse and that this process requiring many processes ends up being costly. In the powder mixing process, the tungsten powder and copper powder are in a compaction state when they are compounded. Since reducing gas does not infiltrate satisfactorily into the green compact when sintering, the surface of the tungsten particle cannot be reduced sufficiently. The wettability of the copper powder in a liquid phase thus worsens against the tungsten powder causing thereby the voids.

Since the copper powder itself is not reduced enough, the remaining oxygen causes its thermal conductivity to diminish.

The powder mixing method is further problematical in that, when copper powder and tungsten powder are mixed, highly ductile copper is likely to aggregate causing thus a copper pool or pore in the sintered body. In general, fine alloy has thus far hardly been obtained from these materials.

Although the copper aggregate produced in the mixing of powder may be powdered down by long-hour milling (for example, 120-hour milling with ball mill), this long-time milling admits impurities to mingle into the compound from the inner wall of the recipient to reduce the electrical and thermal conductivity, which is another problematical point.

To get a good powder mixture of copper and tungsten, an attempt was made to compound, for instance, tungsten oxide with copper oxide and reduce this mixture. Because this process is accompanied by higher reduction temperature of tungsten, the copper results in re-aggregation. Further, the mixed powder thus obtained becomes less soft, which makes it difficult to treat it in the subsequent processes.

It is therefore a general object of this invention to provide a copper-tungsten alloy which is homogeneous and highly dense, excellent in thermal conductivity and transverse rupture strength improving the wettability of copper in the liquid phase to the surface of tungsten particle by adding phosphor and removing the oxygen in copper powder as well as the manufacturing process for this alloy.

It is still a more specific object of this invention to manufacture a powder mixture where the copper is uniformly dispersed without being aggregated and the impurities due to milling are little to get high quality copper-tungsten alloy from this powder mixture.

DISCLOSURE OF THE INVENTION

As a result of varied intense researches and studies made to solve such problems as above, the inventors could bring this invention to completion finding the fact that the excellent configuration as below can be adopted.

First, the copper-tungsten alloy by the first invention is characterized in that it contains 5 to 30 weight percent of copper, 0.002 to 0.08 wt. % of phosphor, and the residual is substantially all tungsten.

It is preferable that the copper-tungsten alloy contains 0.1 to 0.5% of cobalt, nickel or iron or any combination of two out of these elements in order to help sintering.

This copper-tungsten alloy can be manufactured as follows. A minute quantity of phosphoris added to a mixture of copper powder and tungsten powder. The new mixture thus obtained is pressurized and molded into a prescribed shape and the molded part is sintered. It is desirable in this case to add any one powder or combination of two powders out of cobalt, iron or nickel.

As for the compound of the copper and tungsten, it is preferable that the powder of copper oxide is used instead of the copper powder and the copper oxide-tungsten powder mixture obtained from compounding said copper oxide and tungsten powder is reduced under a reductive atmosphere at a temperature range of 100° to 300° C. into copper-tungsten the powder mixture.

THE BEST MODE FOR CARRYING OUT THE INVENTION

Figure 1:
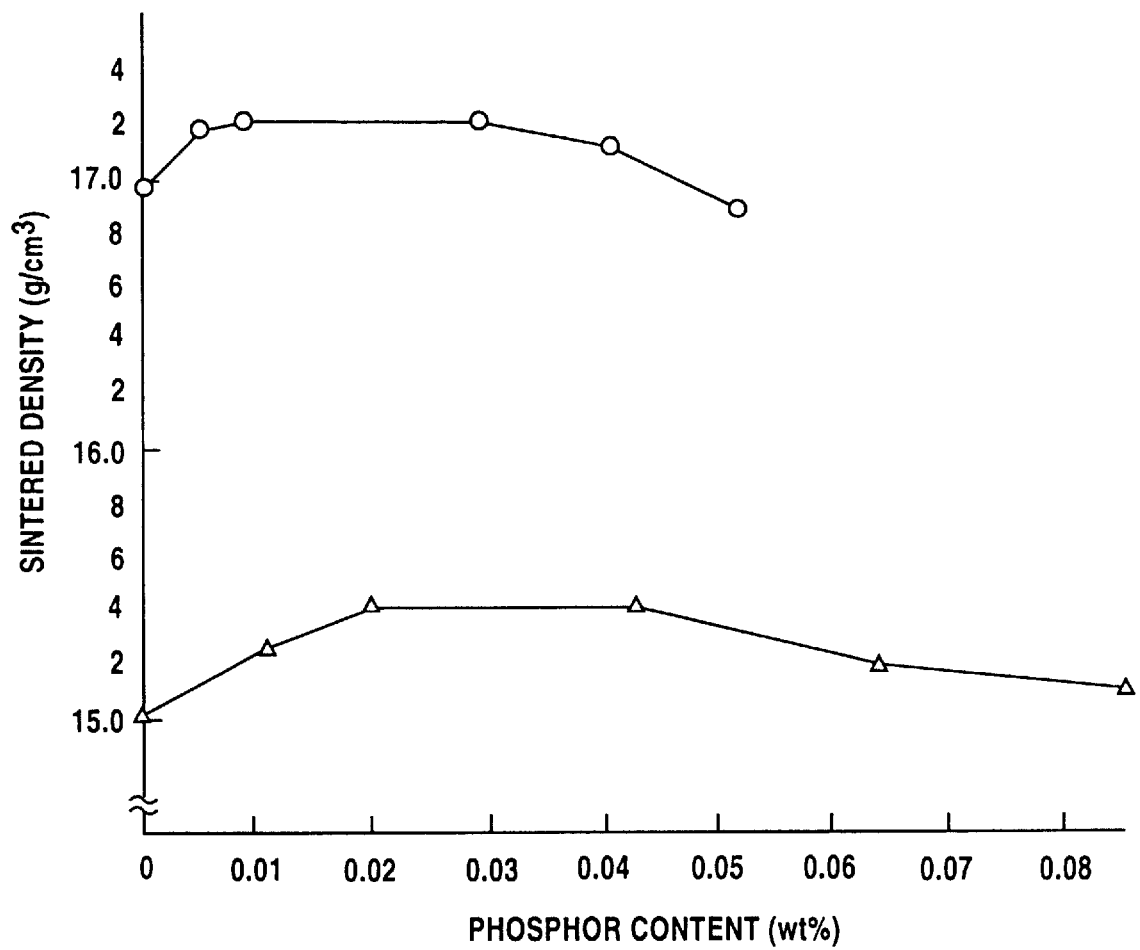
FIG. 1 is a graph showing the relationship between the phosphor content and sintered density in Examples 1 (○ mark) and 2 (Δ mark).
Figure 2:
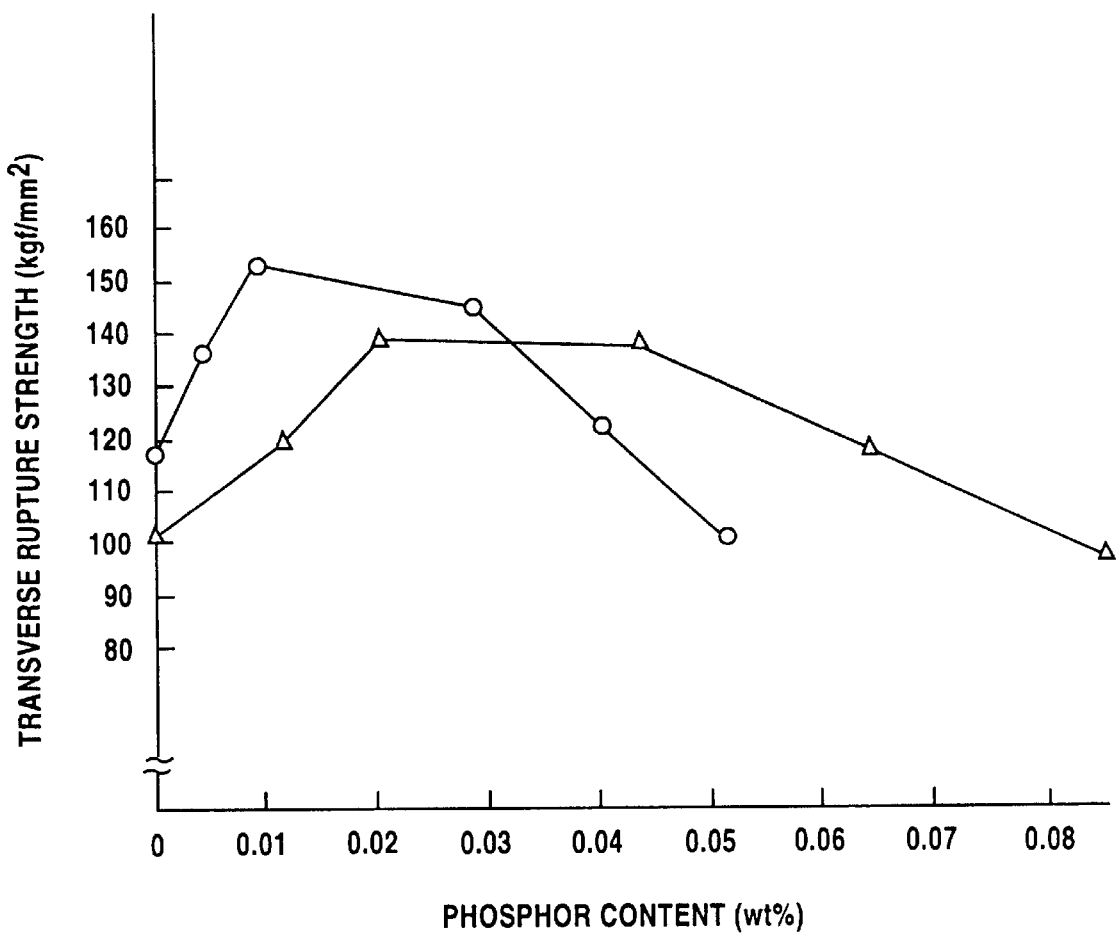
FIG. 2 is another graph depicting the relationship between the phosphor content and transverse rupture strength in Examples 1 (○ mark) and 2 (Δ mark).
Figure 3:
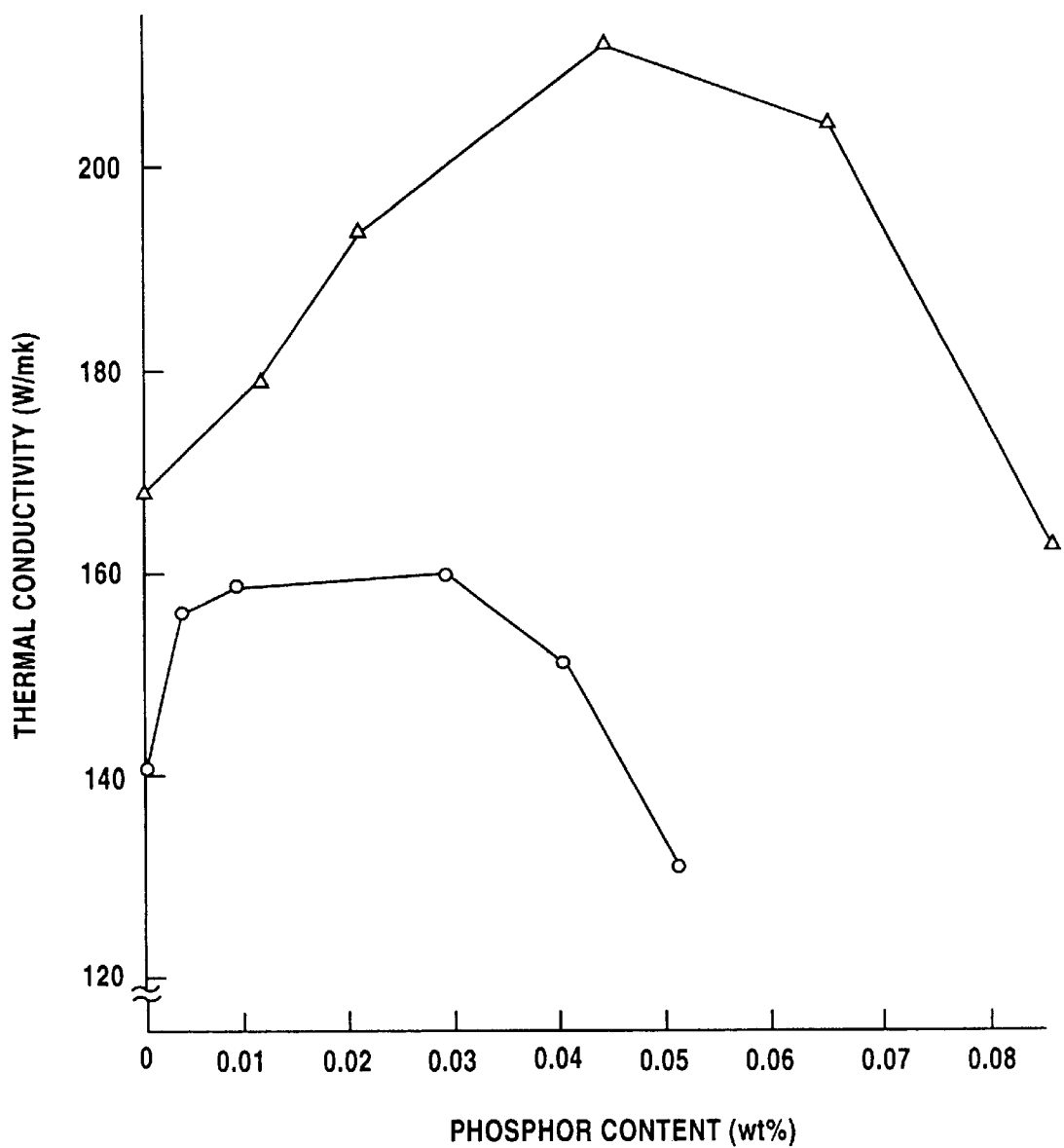
FIG. 3 illustrates the relationship of the phosphor content with the thermal conductivity in Examples 1 (○ mark) and 2 (Δ mark).

The copper powder as raw material is preferably fine powder of the order of 0.5 to 30 μm. It is further preferable that the tungsten powder used as raw material be powdered metal of the order of several μm in grain size that has conventionally been used as a material for powder metallurgy.

The phosphor is preferably added in the form of normal copper phosphide ($Cu_3P$), mixed powder of copper containing 8 weight percent of phosphor (available in the commercial market), cobalt phosphide ($Co_2P$), nickel phosphide, cobalt phosphate and copper phosphate.

In the case of the copper-tungsten alloy according to this invention, the phosphor content in the alloy is preferably 0.002 to 0.04 wt. %. According to the inventor' experiments, this invention affords an advantage that the copper-tungsten alloy with performance equivalent to the sintered alloy under normal sintering temperature can be obtained even at such a low sintering temperature as 50° to 80° C.

Boron in equivalent amount was usable as a deoxidizing agent too.

We will now describe how to manufacture such copper-tungsten alloy. First, copper powder, tungsten powder, phosphor, and occasionally powder of said iron group metal, for instance, cobalt powder are mixed in prescribed proportion.

This compounding is preferably made using, for instance, such milling apparatus as ball mill. The mixing time, which may be defined as the duration at the end of which a homogeneous mixture is obtained, is 80 to 100 hours under normal conditions if a ball mill is used. It is however desirable to perform wet mixing adding, for example, alcohol.

The powder mixture thus obtained is granulated by publicly known method, molded under pressure and sintered, which allows us to get an alloy where the copper and tungsten are uniformly dispersed.

We will now describe a preferred mixing process of copper and tungsten powder. Though in general the copper powder in solid phase was used conventionally, the inventors have found out the fact that the copper-tungsten powder mixture is advantageously manufactured by reducing under reductive atmosphere and at 100° to 300° C. of temperature range the copper oxide-tungsten powder mixture as obtained from compounding said copper oxide powder and tungsten powder using the copper oxide instead of the copper powder.

Though this method employs $Cu_2O$ powder and CuO powder as copper oxide powder to be used as raw material, the former is preferred to the latter, because the latter contains more oxygen and further that the oxygen is likelier to remain in this powder. Since in general the copper oxide powder is brittle, it tends to be easily powdered down during the milling process. This characteristic allows us to get a mixed powder where the copper oxide is uniformly dispersed by low energy requiring milling in a shorter time.

The tungsten powder used as raw material in this method is a metal powder, several $\mu m$ in grain size, used conventionally as material for powder metallurgy as in the foregoing case. It is desirable to add, as a sintering auxiliary to accelerate the sintering process, 0.4 wt. % or below of the whole, more preferably 0.2 to 0.4 wt. % of dissimilar metals, for example, cobalt, nickel or iron. Both cobalt and nickel are to be added as metal powder, phosphide or phosphate. The grain size of said copper oxide powder is preferred to be relatively fine powder of the order of minus 125 mesh. The copper oxide powder and tungsten powder are mixed in prescribed proportion. This mixing is preferably performed using, for instance, such milling apparatus as ball mill and Attoritor. The mixing time, which is defined as the time required for uniform mixing status is achieved, is several tens of hours under normal conditions if, for instance, a ball mill is employed. This mixing is desirably the wet mixing with alcohol added.

The copper oxide-tungsten powder mixture thus obtained is suitably dried up and then heated under reductive atmosphere (normally hydrogen) at a temperature range of 100° to 300° C., more preferably 250° to 250° C. to reduce the copper oxide. Any temperature out of this range is undesirable, because the reducing reaction does not evolve if the reducing temperature is under 150° C. and that the copper aggregates if it is above 250° C.

This reduction allows us to have a copper-tungsten powder mixture in which copper and tungsten are homogeneously dispersed and mixed. This powder mixture or this mixture plus minute quantity of phosphor is molded under pressure by conventionally known method and sintered to give an alloy where the copper and tungsten are uniformly compounded.

EXAMPLE 1

A copper alloy containing 10% of tungsten was manufactured experimentally under the following conditions. The powdered raw materials used were 180 g of commercially available tungsten powder, 1.8 $\mu m$ in mean grain size, 20 g of commercially available copper powder, 7 $\mu m$ in mean grain size, 0.45 g (0.2 wt. %) of commercially available cobalt powder, 1.5 $\mu m$ in mean grain size and copper phosphate. Six levels of phosphor contents were adopted: 0, 0.004, 0.009. 0.028, 0.04, and 0.051 wt. %. Four levels out of these 6, that is, 0.004, 0.009, 0.028 and 0.04 weight percent correspond to the product by this invention in the phosphor content as shown in Table 1. Added to these powdered raw materials was 60 cc of ethyl alcohol. They were wet-mixed for 96 hours using a ball mill (with cemented carbide balls). Added to the metallic powder mixture thus obtained was PVP dissolved into ethyl alcohol as a binder for granulation. The PVP loading was 1.0 wt. %. The powder was granulated by publicly known method, and molded under pressure using a mechanical press as powder press. The dimension of the molded part was 10×30×5 mm, and the pressure was 1.5 tons/cm².

The molded part thus obtained was sintered under hydrogen atmosphere. The sintering condition was at 1,250° C. for one hour. Sintered copper-tungsten alloy, 8×24×4 mm in dimension was obtained by this sintering. The characteristics of this sintered copper-tungsten alloy were as shown in Table 1.

EXAMPLE 2

Then, we attempted a trial production of copper alloy containing 20% tungsten to be used as an electrode for electric discharge machining under the following conditions. The powdered raw materials used were 480 g of tungsten powder, 1.8 $\mu m$ in mean grain size, 120 g of copper powder, 23 $\mu m$ in mean grain size, 1.20 g cobalt powder, 1.5 $\mu m$ in mean grain size and copper phosphate. Six levels of phosphor contents were adopted: 0,0.011,0.020.0.043, 0.064, and 0.085 weight percent. Four levels out of these 6, that is, 0.011, 0.020, 0.043 and 0.064 weight percent correspond to the product by this invention in the phosphor content as shown in Table 2. Added to these powdered rawmaterials was 60 cc of ethyl alcohol. They were wet-mixed for 96 hours using a ball mill. Added to the metallic powder mixture thus obtained was PVP dissolved into ethyl alcohol as a binder for granulation. The quantity of added PVP was 1.5 wt. The powder was granulated by publicly known method, and molded under pressure using a mechanical press as powder press.

The dimension of the molded part was 45×45×50 mm, and the compacting pressure was 1.5 tons/cm$^2$.

The molded part thus obtained was sintered under hydrogen atmosphere. The sintering condition was at 1,200° C. for one hour. This sintering produced sintered copper-tungsten alloy, 34×34×38 mm in dimension. The characteristics of this sintered copper-tungsten alloy were as shown in Table 2.

EXAMPLE 3

A trial production of copper alloy containing 10% of tungsten was conducted under the following conditions. The powder raw materials used were 199.2 g of tungsten powder, 2 μm in mean grain size, to which 0.8 g of cobalt powder was added as sintering auxiliary, 22.5 g of Cu$_2$O powder, minus 125 mesh (20 g as Cu) and minute quantity of copper phosphate. Added to these powdered raw materials (221.7 g in all) was 60 cc of ethyl alcohol, and the mixture was wet-mixed for 48 hours using a ball mill. The ball mill is made from stainless steel and has 1.2 kg of cemented carbide ball.

The powder as mixed with ball mill was heated and reduced under hydrogen atmosphere. The reduction was performed at 200° C. for one hour.

Added to the metallic mixed powders reduced was PVP dissolved in ethyl alcohol as a binder for granulation. The quantity of added PVP was 1.5 weight percent. The powder was granulated by publicly known method, and molded under pressure using a mechanical press as powder press. The dimension of the molded part was 50×50×2 mm, and the compacting pressure was 1.5 tons/cm$^2$.

The molded part thus obtained was sintered under hydrogen atmosphere. The sintering condition was at 1,150° C. for one hour. This sintering produced sintered copper-tungsten alloy, 40×40×1.56 mm in dimension. The characteristics of this sintered copper-tungsten alloy were as shown in Table 3. This table also sets forth the characteristics of comparative examples where, for comparison, powdered copper was used instead of copper oxide, and the raw materials were mixed with ball mill for 48 hours and 120 hours respectively without addition of phosphor (copper powder containing 10 wt. % of tungsten was used for both comparative examples A and B). Other conditions are identical with those of the foregoing examples. The width of the copper pool in Table 3 was 0.01 mm, and the length 0.2 mm. The diameter of the pore was of the order of 0.07 mm.

EXAMPLE 4

Experimentally produced was copper alloy containing 30% of tungsten to be used as an electrode for electric discharge machining under the following conditions. The powder raw material sused were 420 g of tungsten powder, 2 μm in mean grain size to which added were 202 g of Cu$_2$O powder, minus 125 mesh (180 g as Cu) and trace of copper phosphate.

Added to these powdered raw materials (622 g in all) was 180 cc of ethyl alcohol, and the mixture was wet-mixed for 48 hours using a ball mill. The ball mill pot is made from stainless steel and has 3.6 kg of cemented carbide ball.

The powder as mixed with ball mill was heated and reduced under hydrogen atmosphere. The reduction was performed at 180° C. for one hour.

Added to the metallic mixed powder as reduced was PVP dissolved into ethyl alcohol as a binder for granulation. The quantity of added PVP was 1.5 wt. %.

The powder was granulated by publicly known method, and molded under pressure using a mechanical press as powder press. The dimension of the molded part was 45×45×50 mm, and the compacting pressure was 1.5 tons/cm$^2$.

The molded part thus obtained was sintered under hydrogen atmosphere. The sintering condition was at 1150° C. for one hour. This sintering produced sintered copper-tungsten alloy, 34×34×38 mm in dimension. The characteristics of this sintered copper-tungsten alloy were as shown in Table 4. This table also sets forth the characteristics of comparative examples C and D where, for comparison, powdered copper was used instead of copper oxide, and the raw materials were mixed with ball mill for 48 hours and 120 hours respectively without addition of phosphor (copper powder containing 30 wt. % of tungsten was used for both comparative examples). Other conditions are identical with those of the foregoing examples. The sizes of the copper pool and pore in Table 4 were almost same as those in Table 3.

TABLE 1

| | Phosphor content (wt. %) | Sintered density | Transverse rupture strength (kgf/mm$^2$) | Thermal conductivity (W/mk) |
|---|---|---|---|---|
| Comparative specimen | 0 | 16.97 | 118 | 141 |
| Alloy by this invention | 0.004 | 17.19 | 137 | 156 |
| Alloy by this invention | 0.009 | 17.23 | 154 | 159 |
| Alloy by this invention | 0.028 | 17.22 | 146 | 160 |
| Alloy by this invention | 0.04 | 17.13 | 123 | 151 |
| Comparative specimen | 0.051 | 16.89 | 101 | 131 |
| | | Theoretical density 17.24 | | |

TABLE 2

| | Phosphor content (wt. %) | Sintered density | Transverse rupture strength (kgf/mm$^2$) | Thermal conductivity (W/mk) |
|---|---|---|---|---|
| Comparative specimen | 0 | 15.02 | 101 | 168 |
| Alloy by this invention | 0.011 | 15.26 | 119 | 179 |
| Alloy by this invention | 0.020 | 15.42 | 140 | 194 |
| Alloy by this invention | 0.043 | 15.42 | 139 | 212 |
| Alloy by this invention | 0.064 | 15.21 | 119 | 204 |
| Comparative specimen | 0.085 | 15.12 | 98 | 163 |
| | | Theoretical density 15.72 | | |

TABLE 3

|  | Sintered density | Abnormal structure | Impurities (wt. %) | | | Thermal conductivity cal/c/sec/cm |
| --- | --- | --- | --- | --- | --- | --- |
|  |  |  | Iron | Nickel | Chromium |  |
| Alloy by this invention | 17.20 100% | None | 0.12 | 0.03 | 0.01 | 0.31 |
| Powdered copper 48 Mixture (A) | 16.80 97.6% | Long copper pool, Pore | 0.14 | 0.03 | 0.01 | 0.25 |
| Powdered copper 120 Mixture (B) | 17.19 99.8% | None | 0.38 | 0.10 | 0.04 | 0.23 |
| Theoretical density 17.21 | | | | | | |

TABLE 4

|  | Sintered density | Abnormal structure | Impurities (wt. %) | | |
| --- | --- | --- | --- | --- | --- |
|  |  |  | Iron | Chromium | Nickel |
| Alloy by this invention | 14.23 100% | None | 0.10 | 0.02 | 0.006 |
| Powdered copper 48H Mixture (C) | 14.02 98.5% | Long copper pool, Pore | 0.09 | 0.01 | 0.007 |
| Powdered copper 120H Mixture (D) | 14.23 100% | None | 0.23 | 0.07 | 0.02 |
| Theoretical density 14.23 | | | | | |

INDUSTRIAL AVAILABILITY

Because the copper-tungsten alloy according to this invention is excellent in characteristics and can be readily manufactured by powder mixing process, it can be preferably used as the material for electrode, electric contact and semiconductor circuit board.

What is claimed is:

1. A copper-tungsten alloy containing 5 to 30 wt. % of copper, 0.002 to 0.04 wt. % of phosphor, and 0.1 to 0.5 wt. % of one of cobalt, nickel or iron, or a combination of two of cobalt, nickel and iron, and the remaining part being substantially all tungsten.

2. A manufacturing method of copper-tungsten alloy, comprising:

mixing powdered copper oxide, tungsten powder, a small quantity of iron group metal and minute quantity of phosphor to obtain a mixed powder, reducing the mixed powder at a temperature of from 100 to 300° C. under reductive atmosphere, molding the reduced powder under pressure into a prescribed shape, and sintering the molded powder into a sintered body comprising copper-tungsten alloy.

* * * * *